United States Patent [19]

Wheeler

[11] 4,433,835
[45] Feb. 28, 1984

[54] WAFER CHUCK WITH WAFER CLEANING FEATURE

[75] Inventor: William R. Wheeler, Saratoga, Calif.

[73] Assignee: Tencor Instruments, Mountain View, Calif.

[21] Appl. No.: 325,688

[22] Filed: Nov. 30, 1981

[51] Int. Cl.³ ............................................. B25B 11/00
[52] U.S. Cl. ........................................ 269/14; 269/21; 269/903
[58] Field of Search ...................... 269/21, 903, 13–14; 51/235; 198/394, 489, 434, 562, 592, 339; 406/87; 414/222, 224, 89

[56] References Cited

U.S. PATENT DOCUMENTS

| | | | |
|---|---|---|---|
| 499,460 | 6/1893 | Hooper | 198/592 |
| 661,840 | 11/1900 | Baker | 269/21 |
| 1,631,652 | 6/1927 | Sprenger et al. | 269/21 |
| 3,359,879 | 12/1967 | Hamlin | 269/21 |
| 3,610,613 | 10/1971 | Worder | 269/903 |
| 3,652,075 | 3/1972 | Thompson | 269/21 |
| 3,711,082 | 1/1973 | Seidenfaden | 51/235 |
| 3,787,039 | 1/1974 | Zeichman | 269/13 |
| 3,982,627 | 9/1976 | Isohata | 406/87 |
| 4,213,698 | 7/1980 | Firtion et al. | |

FOREIGN PATENT DOCUMENTS 1141607  9/1957  France ............................. 198/339

Primary Examiner—Robert C. Watson
Attorney, Agent, or Firm—Thomas Schneck

[57] ABSTRACT

A wafer chuck and a wafer loading and unloading system wherein a flat support surface of the chuck has a plurality of peaks and valleys, with the peaks minimizing contact with the wafer, yet having sufficient contact area for wafer support without deformation. The peaks are provided with a top edge serving to dislodge particles from a wafer surface when loading the wafer onto the chuck. The loading system includes wafer pushing members for bringing a wafer to a desired position on the support surface.

3 Claims, 11 Drawing Figures

WAFER CHUCK WITH WAFER CLEANING FEATURE

DESCRIPTION

1. Technical Field

The invention relates to holders for semiconductor wafers and in particular to a wafer chuck and loading system for holding a wafer in a manner which minimizes the effects of particulate matter on the wafer.

2. Background Art

In the semiconductor industry, the raw material for production of semiconductor integrated circuits is usually silicon, sapphire or similar material. These materials are manufactured as ingots, approximately cylindrical in shape, having diameters typically between two inches and five inches. The ingots are sliced with diamond-wheel saws into wafers which are a few thousandths of an inch thick. Usually a wafer is semi-rigid, i.e., self-supporting, but subject to deformation by mechanical forces. As soon as wafers are sliced, an attempt is made to keep the wafers free from particulate contamination by using clean rooms for packing, handling and processing of wafers. Nevertheless, even with the cleanest facilities now available, wafers become exposed to particulate matter which adheres to the surface of the wafer.

Holders for semiconductor wafers, known as vacuum wafer chucks, have been devised for holding a wafer in position during wafer processing and testing. Such chucks, exemplified by U.S. Pat. No. 4,131,267 to T. Ono et al., have circular or radial grooves of different sizes defined within a flat surface. Once a wafer is placed on this flat surface and vacuum is applied to grooves covered by one side of the wafer, the wafer is held in place so long as the vacuum remains.

One of the problems encountered with prior art vacuum chucks is that particulate matter on the underside of the wafer, i.e., the side in contact with the vacuum chuck, causes slight but measurable deformations in the opposite side of the wafer once the vacuum is applied. Such deformations or bumps in the wafer cause the exposed wafer surface to yield unreliable data during flatness testing. Flatness is an important quality of the wafer surface because photolithography requires that the entire surface lie in the same focal plane for step-and-repeat processing, whereby a large number of identical patterns is placed on the wafer. If some of the patterns are even slightly out of focus, bad integrated circuit chips, based on the photographic patterns, may result.

An object of the invention was to devise a wafer chuck which would minimize effects of particulate matter on the backside of semiconductor wafers or similar articles.

Disclosure of Invention

The above object has been achieved with a wafer chuck having a rigid wafer support surface with a plurality of peaks and valleys, with peaks at an equal elevation. These peaks form a minimal contact surface for supporting the wafer without deformation. The peaks are truncated, resembling mesas, with flat edges in the direction of wafer loading.

As wafers are loaded transverse to the edges, the edges tend to scrape particulate matter which passes across the edges, so that wafer regions supported by the peaks tend to be particle free. On the other hand, wafer regions which are not supported by peaks, but have particulate contaminants, do not cause flatness problems since these regions are not subject to contact which would cause deformations.

The preferred pattern for the minimal area, peak and valley, support surface is a grid of orthogonal rows and columns of mesas having quadrilateral top surfaces.

In the preferred mode of operation, a wafer is transported by a conveyor to a position on the support surface. As the wafer is moved by the conveyor across the support surface a mild vacuum is applied allowing some particulate matter to be removed as the wafer slides across the support surface. When the wafer covers approximately 80 to 90 percent of the wafer chuck support surface, conveyor motion stops and vacuum pressure is disconnected. The wafer goes to a relaxed position, while two wafer pushing members contact the wafer edges to align the wafer in a desired position on the wafer support surface. During this pushing operation edges of the mesa again have an opportunity to remove particulate matter from the wafer surface. Once the wafer is in a desired position maximum vacuum pressure is applied so that the wafer is securely held in the chuck.

BEST MODE FOR CARRYING OUT THE INVENTION

Figure 1:
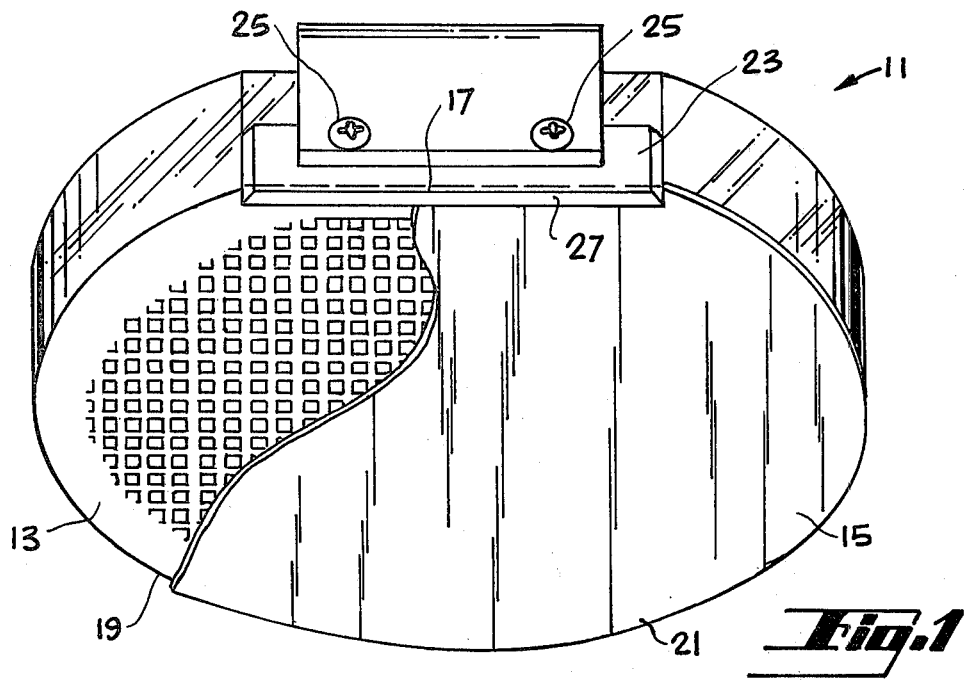
FIG. 1 is a perspective view of a wafer chuck of the present invention.
Figure 2:
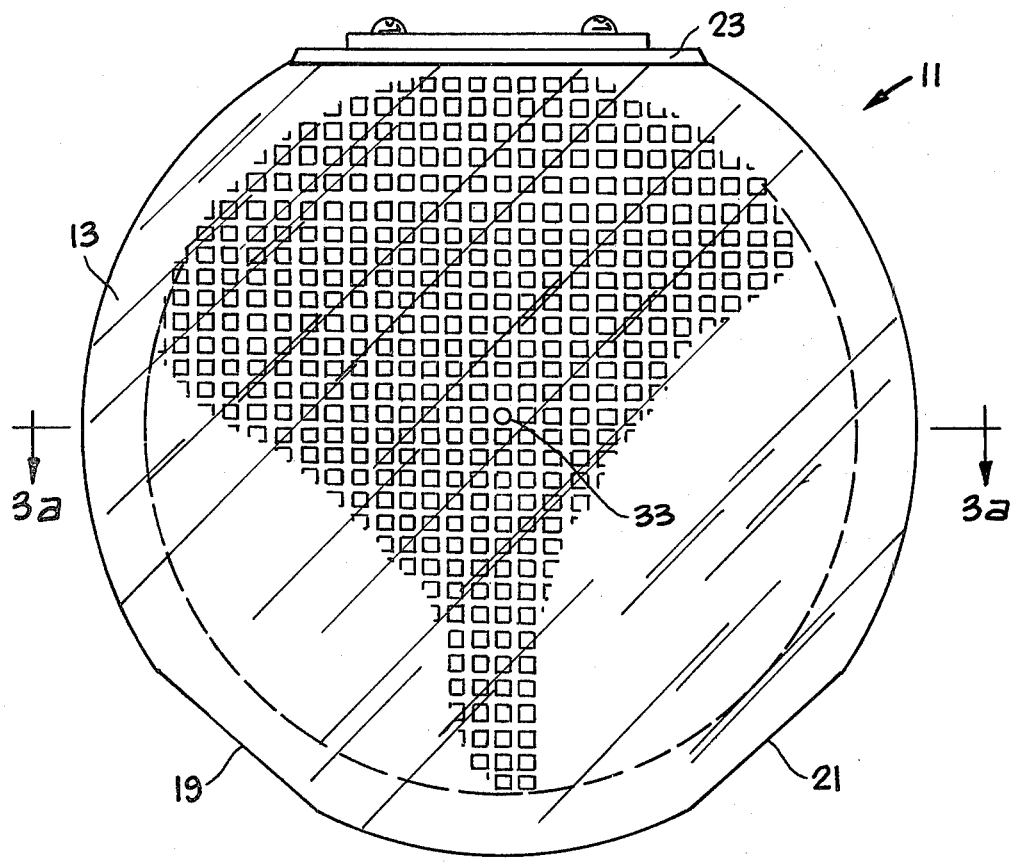
FIG. 2 is a top view of the wafer support surface of the chuck illustrated in FIG. 1.

With reference to FIGS. 1 and 2 a view of the support surface of a wafer chuck 11 is shown. The chuck is generally made of a solid material such as glass or metal, with Pyrex being a preferred type of material because of low thermal expansion properties. The chuck 11 has a rigid wafer support surface 13 which, prior to creation of grooves, is flat within a fraction of a wavelength of light. The overall or gross area of support surface 13 is generally congruent with the area of the wafer 15, to be supported, but may be larger. This would require that the support surface have a major flat edge 17 and perhaps minor flat edges 19 and 21. It is not essential that the support surface coincide with the area of the wafer, although for the wafer loading operation described herein, it is helpful. A member which is useful for wafer loading, although not essential, is an upright wafer stopping member 23 which is connected to the chuck by means of fasteners 25. Stopping member 23 has an edge 27 projecting perpendicularly away from support surface 13 in order to limit wafer travel during loading operations.

An important feature of the present invention is a plurality of peaks and valleys defined in the support surface. By sawing perpendicularly shallow grooves in mutually orthogonal directions, the peaks and valleys may be defined. It is desirable to minimize the area of the peaks in order to minimize the wafer contact area, while simultaneously providing support for a wafer, when vacuum is applied to the grooves, which will keep the wafer in positive contact with the flat reference surface. A preferred shape for the peaks is a truncated cylinder having a top with polygonal edges, forming a mesa. When the peaks are formed by the sawing previously described, the cross sectional shape of each mesa will be a quadrilateral, preferably a rectangle or a square. The grooves or streets which define the peaks should be wide enough so that the ratio of the aggregate area of the peaks which will contact a wafer, compared to the aggregate area of the valleys or streets between the peaks, is less than ten-to-one and is preferably about three-to-one, or even one-to-one, or less.

The grooves need not be sawn, but may be chemically etched, using a mask to protect non-etched areas. The depth of the grooves need not be very deep. A typical depth might be a small fraction of a millimeter, such as 0.3 mm.

FIG. 2 is similar to FIG. 1 except that wafer 15 is removed therefrom, thereby exposing the central aperture 33 which communicates vacuum pressure to the grooves or valleys surrounding the aperture. It is not essential that a central aperture be used. Vacuum ports may be provided in other locations. By communicating vacuum presure to the valleys, a wafer which is supported on the peaks will be pulled toward the chuck surface and held in place.

Figure 3A:
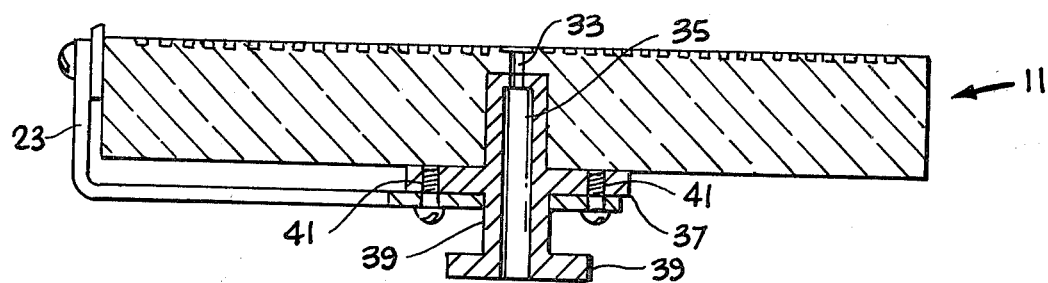
FIG. 3a is a side sectional view of the wafer chuck illustrated in FIG. 2, taken along the lines 3—3.

With reference to FIGS. 3a–3d the loading of a wafer onto the vacuum chuck of the present invention may be seen. In FIG. 3a, the vacuum aperture 33 may be seen to be connected to conduit 35. A spool carrying a pair of flanges 37 and 39 connects the conduit 35 to a vacuum system, while simultaneously providing mechanical support to the chuck. The spool is bonded to the chuck, and the bracket for the stop member is screwed to it.

Figure 3B:
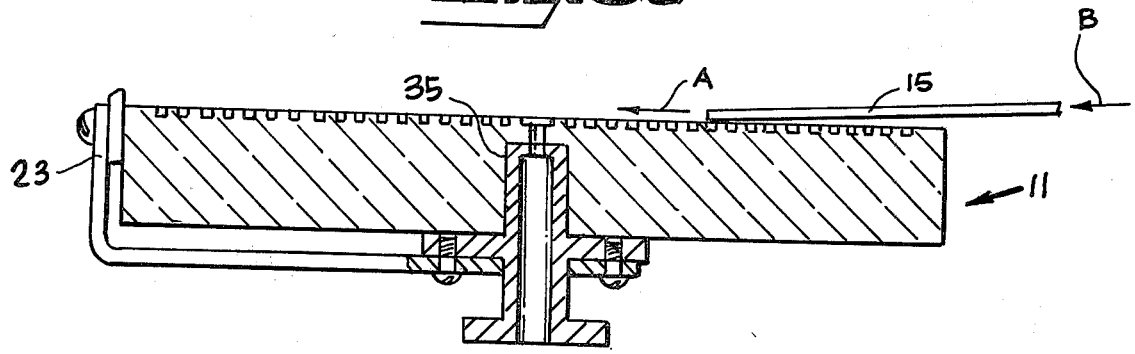
FIGS. 3b–3d illustrate a preferred method of loading a wafer on the chuck of the present invention.
Figure 3C:
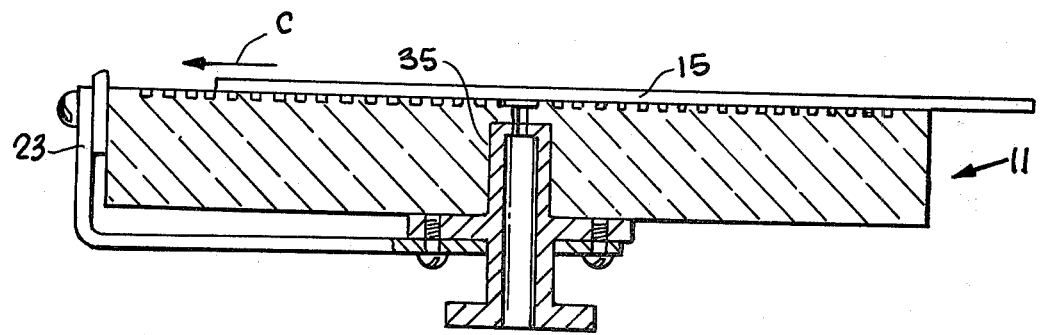
Figure 3D:
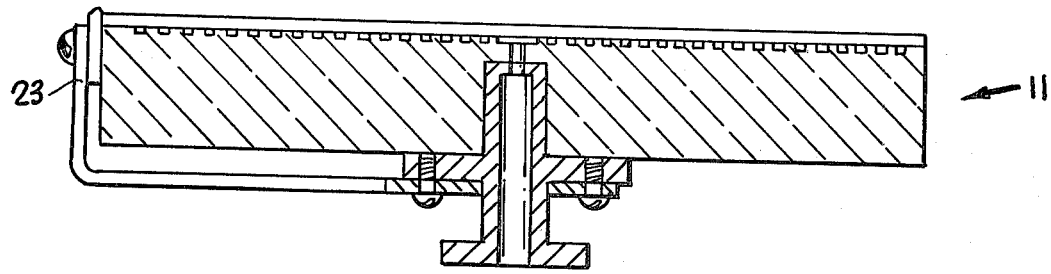

In FIG. 3b, a wafer 15 is being loaded onto the chuck in the direction indicated by arrows A and B. At the time loading is initiated, a mild vacuum is applied through conduit 35. This mild vacuum is intended to remove any particles which can be airborne from either the wafer or chuck surfaces. Once the wafer reaches the position indicated in FIG. 3c, vacuum pressure is released but the wafer remains in intimate contact with the peak surfaces. Pushing members apply force in the direction indicated by arrow C until stopping member 23 halts wafer travel across the chuck. The distance of travel is several times the street-to-street dimension. In this manner, the backside of the wafer has had particles dislodged from the wafer surface by the edges of the peaks. Areas of the wafer surface which reside over valleys may have some particulate matter adhering thereto, but since these areas do not contact support regions, there is no distortion of the opposite side of the wafer surface.

With reference to FIGS. 4a–4d a loading sequence is shown in more detail. Wafer chuck 11 is shown to be supported by an arm 41 which inclines the chuck support surface 13 at an angle which is slightly less than the angle made by belt 43 of a wafer conveyor 45, relative to the horizontal. Wafer 15 tips slightly in the direction indicated by arrows E as it slides off the conveyor, pivoting on conveyor belt wheel 46. A mild vacuum is applied to chuck 11 through the arm 41.

Figure 4A:
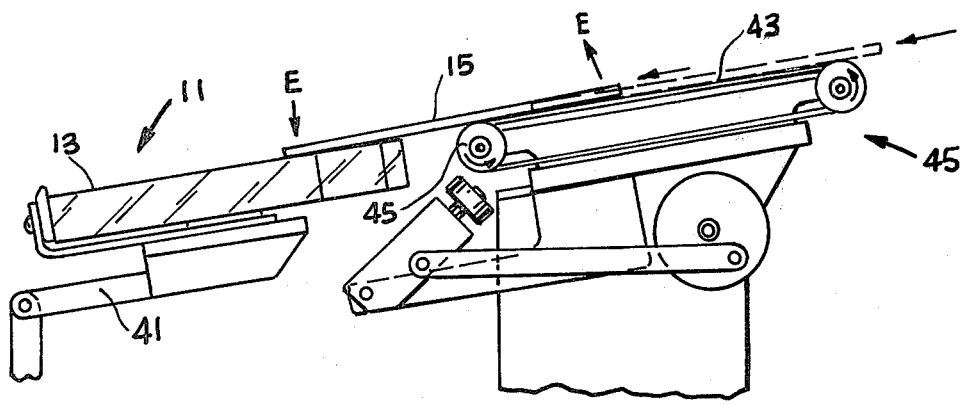
FIGS. 4a–4d illustrate a wafer conveyor and a wafer pushing means for use in loading wafers onto a vacuum chuck.
Figure 4B:
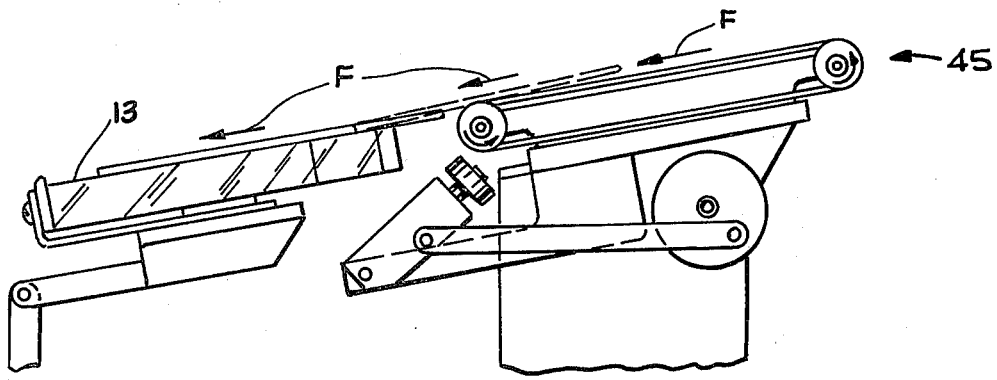

In FIG. 4b, the conveyor 45 continues to push the wafer onto the chuck as indicated by the arrows F until the wafer 13 covers at least 75% of the support surface 13. At this time, vacuum pressure is disconnected and in FIG. 4c a wafer pushing means 51 having a resilient wheel 53 contacting the wafer edge, pushes the wafer in the direction indicated by the arrow G until the wafer comes into contact with a wafer stopping member 23. Wheel 53 is mounted on an axle 55 supported by an upright member 57 which is pivoted at pivot point 59 by a crank 61 and a connecting rod 63. The crank 61 is activated by an optical switch, not shown, which indicates completion of loading of a wafer. Alternatively, the crank may be activated by a timer which indicates completion of travel of a wafer on the conveyor. Continued motion of the crank retracts the wafer pushing means, particularly wheel 53 from contact with the wafer and wafer support surface, as shown in FIG. 4d. As the upright member 57 is retracted in the direction indicated by arrow J a hard vacuum is applied to wafer 15 firmly securing it to the support surface of the chuck. The chuck may then be moved as indicated by the arrows K in FIG. 4e for processing or measurement within a fixture L. It should be noted that wheel 53 is retracted to a position well below the path of the conveyor, so that other wafers may pass over the conveyor onto the chuck, once the chuck has been emptied.

Figure 4C:
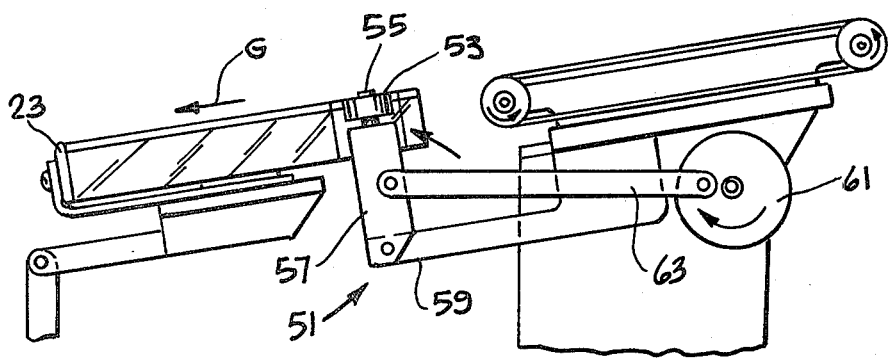
Figure 4D:
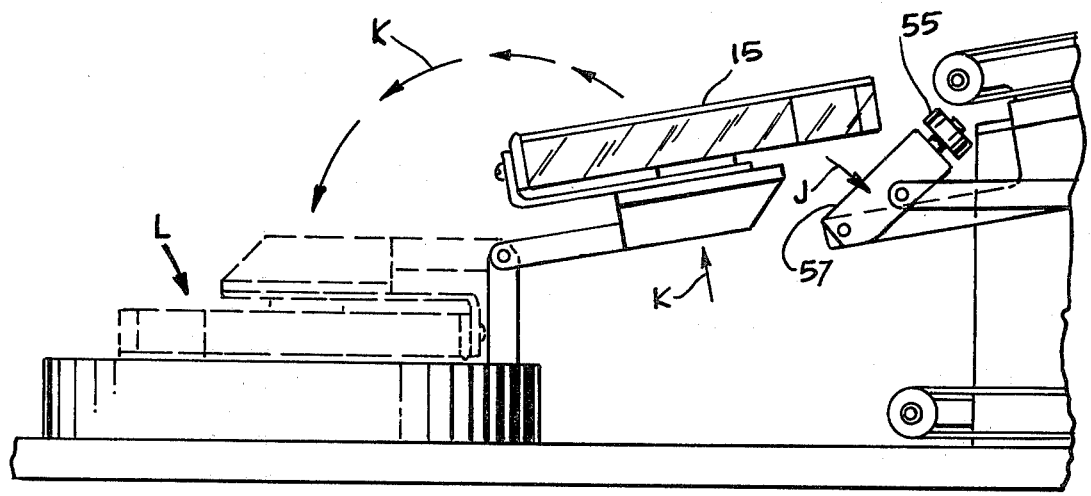
Figure 4E:
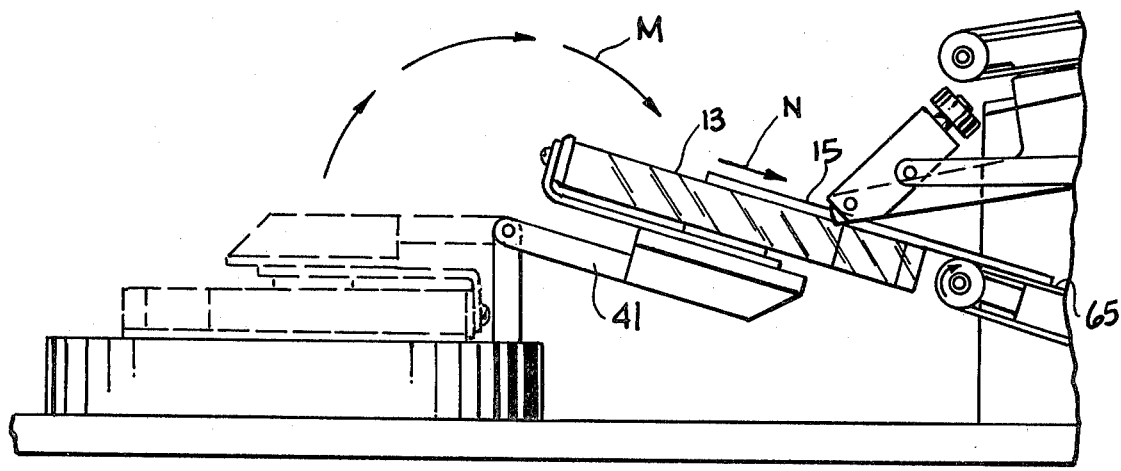
FIG. 4e illustrates unloading of a wafer from the vacuum chuck.

With respect to FIG. 4e, the manner of unloading the chuck is shown. Arm 41 is drawn back in the direction indicated by arrows M to a low position whereby upon release of the vacuum and introduction of a low pressure of air, the wafer will slide from the support surface 13 in the direction indicated by the arrow N. A second conveyor 65 is activated and moves wafer 15 away from the support surface. In a prior patent application, assigned to the assignee of the present invention, Ser. No. 265,412, an alternate wafer pushing means was disclosed wherein a pair of wheels moved by scissors-type action to push a wafer to a desired position for sensing orientation. The entire application described a wafer orientation system. Such a system is used for aligning the flat side of a wafer so that it will travel down a conveyor belt prior to loading in a manner such that the flat edge will contact wafer-stopping member 23. It is important to preserve orientation of a wafer when using the loading method described herein.

In FIGS. 4a–4e only one wheel is shown in the side views. It will be realized that two similar wheels are needed, one on each side of the chuck for pushing the wafer to a desired position. The spacing of the two wafer-pushing members should be sufficient to allow the rim of the chuck, carrying a wafer for unloading, to pass between the two members, as shown in FIG. 4c.

I claim:

1. A wafer chuck and wafer pusher comprising,
a rigid, wafer support surface, having a gross area at least as great as the area of a wafer to be supported, said surface having a plurality of peaks and valleys, said peaks being truncated members having equal elevation, said peaks forming mesas having polygonal edges thereby defining a support plane for the wafer, the ratio of the aggregate area of said peaks contacting the wafer compared to the valleys between said peaks being less then ten to one, said support surface having an area generally congruent with the area of a wafer to be supported, said congruent area of the support surface including a chordal edge region having an upright rigid wafer stopping member extending in elevation above the wafer support plane, the peaks of the support plane forming mesas with polygonal edges in said support plan parallel to said chordal edge, means for communicating vacuum pressure to said valleys, said means of communicating vacuum pressure being variable to release said wafer for travel across the mesas, and wafer pushing means comprising a pair of resilient rollers mounted on top of upright arms, the bottoms of said arms hinged for bringing said rollers below said support plane in a first position and placing said rollers in the support plane in a second position, said wafer pushing means being disposed adjacent to said support surface for urging a wafer oriented in a congruent manner with the support surface into an overlying relation therewith.

2. A wafer chuck and chuck loader comprising, orientation means for orienting a wafer having a flat edge so that said flat edge resides in a specified zone, wafer conveyor means having an input proximate to the orientation means for receiving and transporting a wafer while preserving its orientation and having an output, a rigid, wafer support surface disposed to receive a wafer from the wafer conveyer means output, said support surface having an area generally congruent with the area of a wafer to be supported, said surface having a plurality of peaks and valleys, said peaks being truncated members with polygonal edges having equal elevation thereby defining a support plane for the wafer, the ratio of the aggregate area of said peaks contacting the wafer compared to the valleys between the peaks being less than ten to one, the support surface having a chordal edge region having an upright rigid wafer stopping member, means for communicating vacuum pressure to said valleys of said support surface, said means for communicating vacuum pressure variable to release said wafer for travel across the support surface into a congruent relation therewith, and wafer pushing means comprising a pair of spaced apart, resilient members, mounted on pivoted arms for selectively contacting a wafer rim portion said wafer pushing means being adjacent to said wafer conveyor means and being adjacent to said support surface for urging a wafer oriented in a congruent manner with the support surface into an overlying relation therewith.

3. The chuck of claim 2 wherein said pivoted arms are driven by a crank disk and a connecting rod.

* * * * *